United States Patent [19]

Brown et al.

[11] Patent Number: 5,663,639
[45] Date of Patent: Sep. 2, 1997

[54] APPARATUS AND METHOD FOR OPTICAL HETERODYNE CONVERSION

[75] Inventors: Elliott R. Brown, Billerica, Mass.; Frank W. Smith, Liverpool, N.Y.

[73] Assignee: Massachusetts Institute of Technology, Cambridge, Mass.

[21] Appl. No.: 183,057

[22] Filed: Jan. 18, 1994

[51] Int. Cl.$^6$ .......................... G01R 19/00; H01J 40/14; H04B 10/06

[52] U.S. Cl. .................. 324/96; 250/214 A; 324/158.1; 359/191

[58] Field of Search .................. 324/158.1, 96; 359/189, 191, 326; 250/214 A, 214.1; 257/465

[56] References Cited

U.S. PATENT DOCUMENTS

| | | | |
|---|---|---|---|
| 4,750,217 | 6/1988 | Smith | 359/191 |
| 4,915,744 | 4/1990 | Ho et al. | 257/465 |
| 4,952,527 | 8/1990 | Calawa et al. | 437/107 |
| 5,168,069 | 12/1992 | Smith et al. | 437/5 |
| 5,177,486 | 1/1993 | Kim et al. | 250/214.1 |
| 5,187,487 | 2/1993 | Riza | 342/372 |
| 5,452,118 | 9/1995 | Maruska | 359/191 |
| 5,482,570 | 1/1996 | Saurer | 257/465 |

OTHER PUBLICATIONS

Chen, Y., et al., "375-GHz-bandwidth photoconductive detector," *Appl. Phys. Lett.*, 59(16):1984–1986, (Oct. 1991).

Simonis, G. J., et al., "Optical Generation, Distribution, and Control of Microwaves Using Laser Heterodyne," *IEEE Transactions on Microwave Theory and Techniques*, 38(5):667–669, (May 1990).

Plant, D. V., et al., "Generation of Millimeter-Wave Radiation by Optical Mixing in FET's Integrated with Printed Circuit Antennas," *IEEE Microwave and Guided Wave Letters*, 1(6):132–134, (Jun. 1991).

Day, T., et al., "Optical generation of frequency stabe mm-wave radiation using diode laser pumped Nd:YAG lasers," *SPIE vol. 1839 Solid State Lasers and New Laser Materials*, pp. 136–139, (1991), (month unavailable).

Thaniyavarn, S., et al., "Electro-optic Control of Microwave and Millimeter-wave Signals using Integrated Optical Waveguide Components," *SPIE vol. 1291 Optical and Digital GaAs Technologies for Signal-Processing Applications*, pp. 154–157, (1990) (month unavailable).

Thaniyavarn, S., et al., "Millimeter-wave signal generation and control using optical heterodyne techniques and electro-optic devices," *SPIE vol. 1371 High-Frequency Analog Fiber Optic Systems*, pp. 250–251, (1990), (month unavailable).

Gliese, U., et al., "A Wideband Heterodyne Optical Phase-Locked Loop for Generation of 3–18 GHz Microwave Carriers," *IEEE*, pp. 936–938, Aug. 1992.

*Primary Examiner*—Ernest F. Karlsen
*Attorney, Agent, or Firm*—Hamilton, Brook, Smith & Reynolds, P.C.

[57] ABSTRACT

An apparatus and method for optical heterodyne conversion and a radiation source and integrated diagnostics using the apparatus and method are disclosed. The radiation source can operate in a high-power narrow-band mode in which a constant-frequency output is provided or in a low-power broadband mode in which the frequency is tunable to allow the radiation source to act as a sweep oscillator. The apparatus or photomixer includes two sets of interdigitated conductive electrodes formed on top of a crystal lattice formed of column III–V compounds, particularly InAlGaAs compounds. Additional column V atoms are interspersed within the lattice structure to form defect energy states in the bandgap of the host material. The region of the material between the interdigitated electrodes is illuminated by optical radiation containing two different frequencies. Photon absorption in the material causes a current at the difference frequency to be generated and coupled to the interdigitated electrodes. The current is then coupled to a planar transmission line or antenna structure to generate coherent, continuous-wave, unimodal radiation in the microwave, millimeter-wave, or submillimeter-wave regions.

34 Claims, 9 Drawing Sheets

APPARATUS AND METHOD FOR OPTICAL HETERODYNE CONVERSION

GOVERNMENT SUPPORT

This invention was made with government support under Contract No. F19628-90-C-0002 awarded by the Air Force. The government has certain rights in the invention.

BACKGROUND OF THE INVENTION

Since the development of lasers, optical heterodyne conversion (photomixing) has been useful for coherent detection in many regions of the electromagnetic spectrum. Photomixing has also been proposed as a technique for generating coherent radiation in the microwave and millimeter-wave regions, and interest in this technique has been revived recently by the advances in high-speed III-V device technology. Of the two applications, coherent generation has been much less useful than coherent detection because of the lack of a suitable photomixer. Although difference frequencies have been generated up to 61 GHz, the generated power has been severely limited by at least one of several factors such as low photomixer bandwidth, poor optical power coupling, impedance mismatch between the photomixer element and the load circuit, and degradation of the photomixer properties at high optical pump power.

SUMMARY OF THE INVENTION

The present invention is directed to a photomixer which overcomes the limitations of the prior devices to provide useful levels of continuous-wave power over a very wide operating bandwidth. The photomixer of the invention is formed over a substrate made of a III-V semiconductor material such as gallium arsenide (GaAs). The active photomixer layer of III-V material is formed over the substrate. In one embodiment, the active III-V material is $In_xAl_yGa_zAs$, that is, the material is GaAs, InAs, or AlAs or a combination of the three. These binary compounds are alloyed together to form a homogeneous crystal lattice structure in the active layer. The layer has disposed within the lattice structure additional atoms of the column V or group V element of the compounds. In the embodiment mentioned above, the additional atoms are arsenic atoms. These atoms introduce defects in the crystal structure which increase the optical-to-microwave conversion efficiency and electrical bandwidth of the photomixer. Thus the active layer is a non-stoichiometric material having in a preferred embodiment approximately one percent more of the column V atoms than is required to satisfy the stoichiometry conditions.

An electrically conductive layer is formed over the III-V active layer. The conductive layer includes a region of interdigitated electrodes which are separated from each other to expose the top surface of the active layer. The optical heterodyne conversion process is carried out by illuminating the region of the photomixer between the interdigitated electrodes with optical radiation of two different frequencies. Photon absorption in the active layer causes an electrical current at the difference frequency to be coupled to the interdigitated electrodes, the difference frequency being the positive difference between the two frequencies of the optical radiation illuminating the active layer.

In one embodiment, the active layer is created by low temperature epitaxial growth. During the growth process, an excess or overpressure of the column V element such as arsenic is introduced into the growth chamber. The column V element bonds with the column III elements also being introduced into the chamber to form the crystal lattice structure. At the same time, because of the overpressure of the column V element, column V element defects are introduced into the lattice structure. One process of low temperature growth used to form the active layer is described in U.S. Pat. No. 4,952,527 to Calawa et al. for a "Method of Making Buffer Layers for III-V Devices Using Solid Phase Epitaxy," which is incorporated herein by reference.

In another embodiment, the homogeneous crystal lattice structure is grown on the substrate by conventional techniques. Then, in a subsequent step, the column V defects are introduced by ion implantation.

In one embodiment, the photomixer is driven by two optical sources, such as solid state or semiconductor diode lasers, which emit light at two different frequencies. The outputs of the lasers are fed to an optical combiner which forms a single output beam including light at the output frequencies of the two lasers. The combined beam is directed onto the interdigitated electrodes of the conducting layer and the active layer exposed between the electrodes. The current generated by the active layer at the difference frequency is coupled to the interdigitated electrodes.

The photomixer of the invention has various applications, two of which are a constant frequency radiation source and a sweep oscillator. In these applications, at least one of the driving lasers is tunable such that a range of difference frequencies can be achieved. The combined beam from the optical combiner is focused by a lens onto the interdigitated electrode region of the photomixer. The electrodes are coupled to a broadband planar antenna such as a bow tie or spiral antenna, or a resonant antenna such as a dipole, which is preferably formed as part of the conducting layer of the photomixer. The signal at the difference frequency is radiated through the substrate of the photomixer and out the bottom where it is transformed by a lens into a gaussian profile beam of coherent radiation which forms the generated output of the source or oscillator.

Because the driving lasers operate at high optical frequencies, large generated difference frequencies result from only small relative variations in the laser output frequencies. The increased bandwidth and conversion efficiency of the active layer of the photomixer have allowed signals at frequencies in the terahertz to be generated at useful power levels. If the laser outputs are held at constant frequencies, then the source will generate a coherent output signal at a selected constant frequency. The output power can then be maximized in a narrow band around the constant frequency by coupling the photomixer to a resonant circuit, such as a dipole antenna whose resonant frequency is near the selected constant frequency. Thus, a narrow band high power source is created. In another embodiment, the photomixer is used to generate radiation at constant lower power levels over a very wide frequency band. In this embodiment, the photomixer is coupled to an antenna having a wide band constant radiation resistance. This embodiment is especially suited for use as a sweep oscillator source in which one or both of the laser outputs is swept in frequency to provide for frequency-domain analysis of systems under test. Because of the high frequencies of the driving lasers, a very wide band of frequencies can be swept very quickly. Also, the relatively constant wide band resistance of the antenna provides a constant power output over the swept range.

Both the constant frequency radiation source and sweep oscillator allow testing to be performed directly on circuits and systems at very high frequencies. With prior low-frequency sources, systems and devices were tested at lower frequencies and the results were extrapolated to predict high-frequency results. Because of device parasitics and behavior anomalies at high frequency, the extrapolated results could be inaccurate. With the source of the present invention, a high fixed-frequency high-power output or a wideband low-power swept output can be generated to directly measure and hence accurately characterize the high-frequency performance of devices and systems under test.

As mentioned above, the photomixer is operable in at least two modes—a wideband low-power mode and a narrow-band high-power mode. The former lends itself to the sweep oscillator application in that its frequency range can be swept over a range of approximately 50 GHz to 1 THz at constant power of about 1 mW to provide wide-band frequency characteristics of a device or system under test. In the narrow-band high-power mode, approximately 10 mW of power can be achieved over a narrow frequency band, i.e., less than roughly 20% of the band center frequency. In this mode, the photomixer can be used in high-frequency applications requiring a constant frequency source at high power such as a local oscillator in a high-frequency receiver.

The mode in which the photomixer operates is determined by the form of the antenna which radiates its output at the difference frequency. Antennas such as spirals and bow ties provide relatively constant impedance over a wide range of frequencies and therefore radiate the output over a wide band. Resonant antennas such as dipoles and slot antennas provide a high peaked antenna impedance at a narrow frequency range. This results in a narrow-band high-power photomixer output.

In another application, the photomixer of the invention is used as a diagnostic tool integrated with a high-frequency circuit to perform tests on the circuit. In this application, both the photomixer and the circuit under test, such as a field-effect transistor (FET) amplifier, can be formed on a single substrate, with the photomixer being formed in a non-stoichiometric buffer layer below the FET (see U.S. Pat. No. 4,952,527 to Calawa et al.). The interdigitated electrodes of the photomixer are electrically coupled to the gate contact of the FET. The region containing the interdigitated electrodes is illuminated by the combined beam of the two laser frequencies, and the difference frequency is coupled to the FET as an excitation input. The difference frequency used to test the device can be constant where the input driving lasers are held constant or it can be swept by varying the frequencies of the driving lasers to perform frequency-domain analysis.

The output of the FET is coupled to the center conductor of a transmission line, such as a coplanar waveguide. This output can be used to drive an antenna to radiate the FET output signal to a receiver for monitoring, or the output signal can be detected directly from the transmission line. In either case, an input-output characteristic for the device being tested is obtained over the high-frequency range of the photomixer. After testing is completed, the photomixer can be eliminated from the circuit by an additional step of depositing conductive material between the electrodes to essentially short out the photomixer. As in the sweep oscillator and fixed frequency signal source applications, the photomixer of the invention provides a high-frequency capability which can be used to directly test high-frequency devices and systems. Direct characterizations can be obtained for devices where prior instruments required that low-frequency test results be extrapolated to high-frequency ranges.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
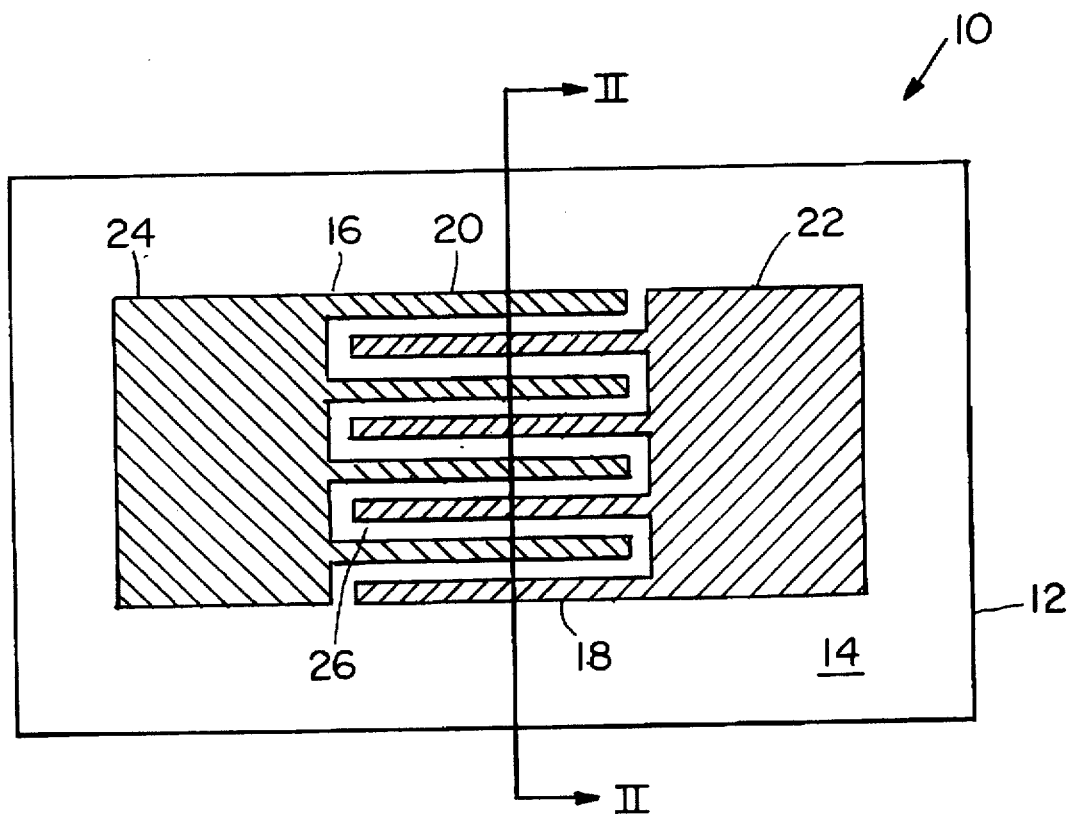
FIG. 1 is a schematic top view of the photomixer of the present invention.
Figure 2:
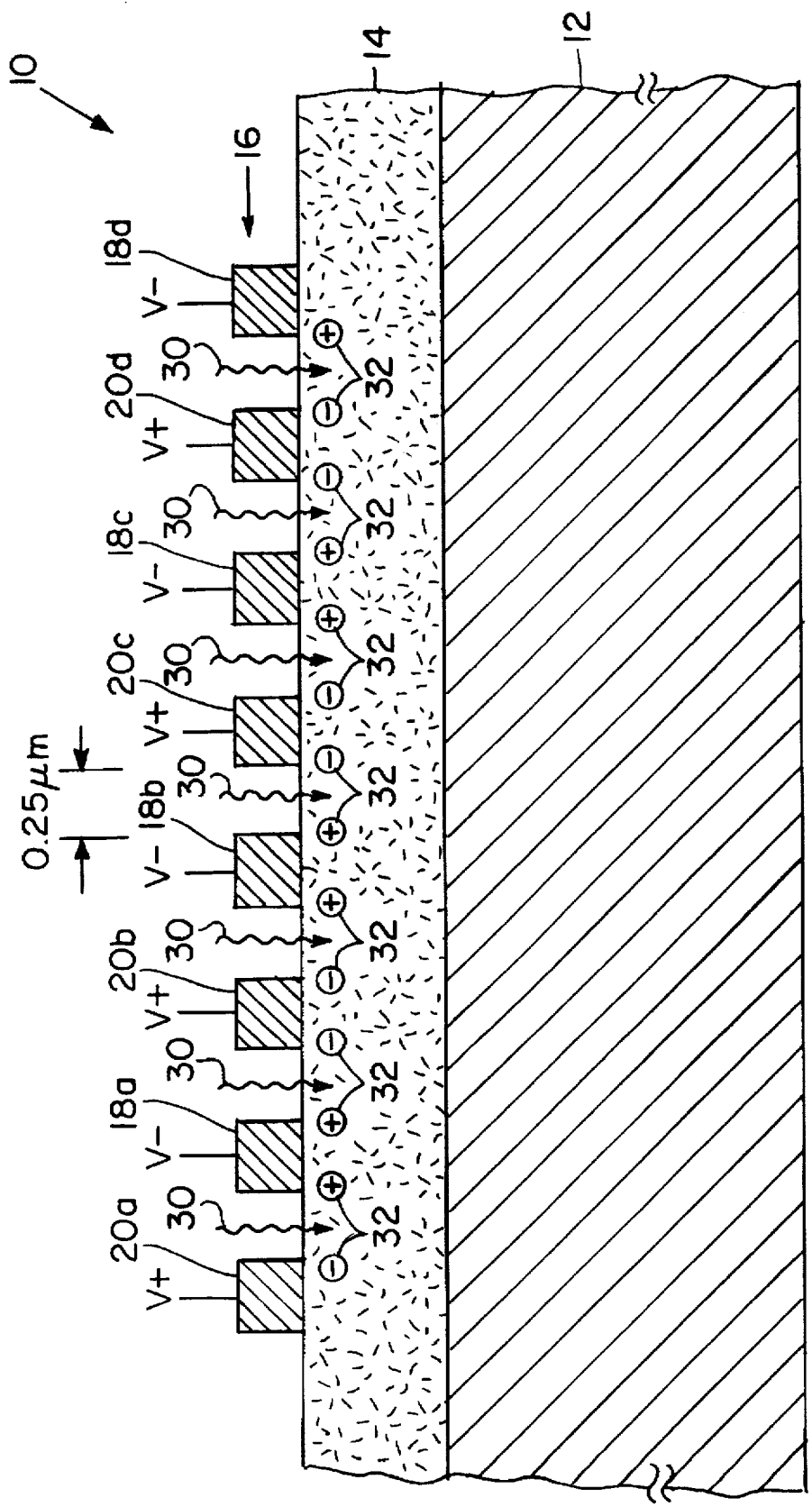
FIG. 2 is a schematic cross-sectional view taken along line II—II of FIG. 1.

FIG. 1 is a schematic top view of the photomixer 10 of the present invention, and FIG. 2 is a cross-sectional view of the photomixer of FIG. 1 taken along line II—II. The photomixer 10 includes an active semiconductor layer 14 over a substrate 12. An electrically conducting layer 16 is formed over the active layer 14. The conducting layer 16 comprises two sets 18 and 20 of interdigitated electrodes or interlocking fingers. Each set of electrodes is connected to a conducting pad on the conducting layer. Electrodes 18a–d are connected to conducting pad 22, and electrodes 20a–d are connected to conducting pad 24.

During operation, the interdigitated electrodes 18 and 20 as well as the region 26 of the active layer 14 exposed between the electrodes are illuminated by optical radiation of two different frequencies. Photon absorption in the active layer 14 results in the generation of electron-hole pairs in the layer. Because the photocurrent is a quadratic function of the optical electric field in the layer, a coherent signal at the difference frequency between the combined input laser signals is generated within the layer. The coherent difference signal is coupled to the interdigitated electrodes and to their respective conductive pads 22, 24.

The substrate 12 is made of a III–V material such as GaAs. The active layer 14 is formed on the substrate 12 and is composed of at least one III–V compound in a homogeneous crystal lattice structure. In one embodiment, the structure is a lattice of an $In_xAl_yGa_zAs$ material, where $0 \leq x \leq 1$, $0 \leq y \leq 1$, $0 \leq z \leq 1$, and $x+y+z \approx 1$. That is, it is a combination of InAs, AlAs and GaAs in a homogeneous zincblende crystal lattice, where one or more of the compounds may not be present in the layer 14 and the compounds are generally not present in equal quantities.

To achieve the desirable physical attributes of the active layer 14, an overabundance of atoms of the column V element, arsenic in the preferred embodiment, are introduced into the layer 14. This results in defect states in the active layer 14 which are within the energy band gap of the host crystalline material. This can be accomplished by several different methods. One method involves low-temperature epitaxial growth of the active layer 14 over the substrate 12. This method and the low-temperature-grown (LTG) material formed thereby are described in U.S. Pat. No. 4,952,527 to Calawa et al. for a "Method of Making Buffer Layers for III–V Devices Using Solid Phase Epitaxy," which is incorporated herein by reference.

In this first method, called molecular beam epitaxy (MBE), boats of the elements in their pure solid states are placed within a vacuum chamber along with the substrate. The boats are heated to evaporate the materials onto the substrate. To achieve the overpressure of the column V material, the temperature of the column V boat is increased somewhat. In a preferred embodiment using this approach, the low-temperature growth process results in the $In_xAl_yGa_zAs$ layer 14 with As defect states within the band gap of the layer material.

In another method, the active layer 14 can be formed by standard epitaxial growth techniques. Following growth of the layer 14, the defects are introduced by arsenic ion implantation. Once again, column V defect states within the band gap of the host material are introduced.

FIG. 2 shows the interdigitated electrodes 18a–18d and 20a–20d within the conducting layer 16 over the active layer 14. In a preferred embodiment, the widths of the electrodes are within the range 0.1 to 1.0 micrometer and the widths of the gaps between them are within the range of 0.1 to 10.0 micrometers. When the photomixer 10 is operated, a bias voltage is applied across the sets of electrodes 18 and 20. This is indicated by the $V_+$ positive bias voltage shown on the electrodes 20a–20d and the $V_-$ negative bias voltage applied to the electrodes 18a–18d. The bias voltage creates a static electric field within the active layer 14 across the gap between electrodes.

The optical heterodyne conversion takes place as the combined coherent laser output beams of different frequencies, indicated by reference numeral 30, strike the active layer 14 between electrodes 18 and 20. Photon absorption in the layer 14 causes electron-hole pairs 32 to be generated within the layer 14. The electric field applied between the electrodes 18, 20 sweeps the electrons to the positively biased electrodes 20a–20d and the holes to the negatively biased electrodes 18a–18d, resulting in a photocurrent generated in the layer 14.

The quadratic relationship between the optical electric field and the photocurrent results in a signal generated at the difference frequency between the frequencies of the two input lasers. The signal is coupled to the electrodes and the resulting coherent signal at the difference frequency can be radiated away from the photomixer by a planar antenna such as a bow-tie, spiral antenna, or dipole, or other similar structure. Alternatively, the signal can be conducted away by a planar transmission line coupled to the conducting layer 16.

The InAlGaAs material of the active layer exhibits characteristics which facilitate the photomixing process. The material displays the photoconductor properties of a very short electron-hole recombination time ($\tau<1$ picosecond) as well as high DC breakdown field $E_B > 1 \times 10^6$ V cm$^{-1}$. In addition, it also displays a high photocarrier mobility $\mu \approx 200$ cm$^2$ V$^{-1}$ s$^{-1}$ relative to semiconductors having a comparable recombination time. Together these properties facilitate the heterodyne conversion process. Specifically, the high DC breakdown field allows a larger bias voltage to be applied across the electrodes. As a result, carriers are swept more quickly and efficiently by the electric field to the electrodes, thus resulting in higher conversion efficiency, i.e., the ratio of the optical power of the generated signal at the difference frequency to the total optical power of the combined input beam. The short electron-hole recombination time or photocarrier lifetime results in the large electrical bandwidth of the photomixer.

Further details of the physical properties and the theory of operation of the photomixer device can be found in "Coherent Millimeter-Wave Generation by Heterodyne Conversion in Low-Temperature-Grown GaAs Photoconductors," by Brown, Smith and McIntosh, in Journal of Applied Physics, Volume 73, No. 3, Feb. 1, 1993, and in "Measurements of Optical-Heterodyne Conversion in Low-Temperature-Grown GaAs," by Brown, McIntosh, Smith, Manfra and Dennis, in Applied Physics Letters, Volume 62, No. 11, Mar. 15, 1993, both of which are incorporated herein by reference.

Figure 3:
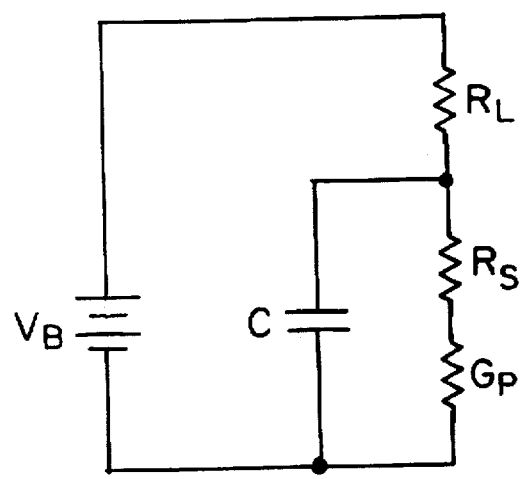
FIG. 3 is an equivalent circuit diagram for the photomixer of the present invention.

FIG. 3 is an equivalent circuit diagram for the photomixer of the invention. The photomixer can be represented electrically by a photoconductance $G_P$ that is a function of the absorbed optical power. Because the essential photoconductive properties of the active layer material, i.e., absorption strength, mobility and recombination time, are assumed to be independent of the electrode voltage, $G_P$ can be approximated as an ohmic conductance. In the equivalent circuit in FIG. 3, $G_P$ is connected in series with a small contact resistance $R_S$. Both elements appear in parallel with a capacitance C that is a function of the electrode geometry and the dielectric constant of the active photoconductive material. In this circuit, the electrodes are connected either to a planar distributed circuit, such as a broadband spiral antenna or a coplanar waveguide, or to a planar resonant circuit, such as a dipole. In both cases, the planar circuit can be presented electrically by the resistance $R_L$. In the distributed circuit, $R_L$ is relatively small but nearly constant over a very wide frequency range. In the resonant circuit, $R_L$ is relatively large over a much narrower frequency range. The electrical bias for the circuit is supplied by the voltage source $V_B$.

Figure 4:
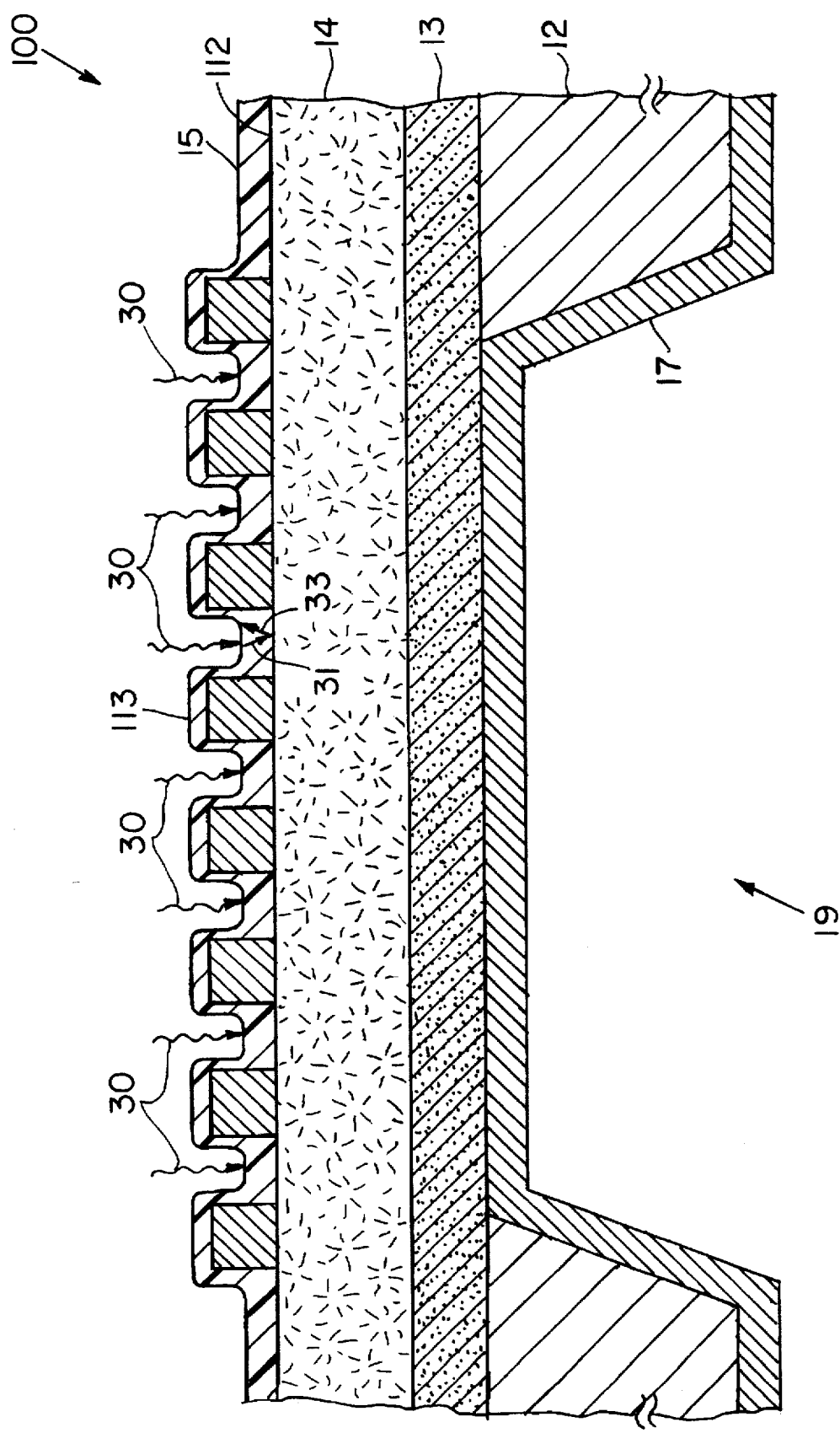
FIG. 4 is a schematic cross-sectional view of an alternative embodiment of the photomixer of the present invention.

FIG. 4 is a schematic cross-section of an alternative embodiment 100 of the photomixer of the present invention. In this embodiment, the photomixer 100 includes a buffer layer 13 of low-temperature-grown AlGaAs between the active layer 14 and the substrate 12. This layer 13 prevents electron-hole pairs generated in the active layer 14 from migrating down into the substrate 12 while not absorbing a significant fraction of the incident laser power.

This embodiment also includes an anti-reflection layer 15 of a dielectric material such as silicon nitride ($Si_3N_4$) deposited over the photomixer 100. The anti-reflection layer 15 is designed to reduce the reflection of light caused by the difference in refractive index at the boundary between the active layer 14 and the air above it. The index of refraction of the anti-reflection layer 15 is chosen to be as close as possible to the geometric mean of the indices of refraction of the air and the active layer 14. In the case of a GaAs active layer 14, the geometric mean is about $\sqrt{1 \times 13} \approx 3.6$.

Incoming light 30 strikes the top surface 113 of the anti-reflection layer 15. Most of the light enters the layer 15 and is not reflected. Most of the light, indicated by the ray 31, strikes the interface 112 between the layer 15 and the active layer 14 at a low enough angle such that it is reflected back toward the top surface 113 of the anti-reflection layer as indicated by arrow 33. The thickness of the anti-reflection layer 15 is selected to be approximately one-fourth the wavelength of the light illuminating the photomixer 30. As a result, as the reflected light 33 reaches the top surface 113 of the anti-reflection layer 15, it is 180° out of phase with the incoming light 30 at the top surface 113. The opposite phases of the coherent light beams cancel the portion of the incident beam that would otherwise be reflected at the top surface 113. Thus, transmission of light from the laser sources into the active layer 14 is substantially increased. Since the output power of the photomixer 100 is proportional to the square of the transmission of the incoming light, the anti-reflection layer provides a corresponding substantial improvement in the photomixer conversion efficiency.

The embodiment of FIG. 4 also includes a reflecting layer 17 at the bottom of the AlGaAs buffer layer 13. In this embodiment, a via hole 19 is formed by reactive ion etching or other technique through the bottom of the substrate 12 up to the bottom of the buffer layer 13. The layer 17 is formed of a metal such as titanium or gold which is deposited onto the inner surface of the via hole 19 and the bottom surface of the layer 13 by evaporation or other means.

This metallization layer 17 performs at least two functions. First, it reflects photons which pass through layers 13 and 14 without forming electron-hole pairs. As these photons re-enter the active layer 14, they can be absorbed to form electron-hole pairs. Thus, the reflecting layer 17 provides photons a second chance to generate photocurrent, which results in improved conversion efficiency for the photomixer 100. The reflecting metallized layer 17 also serves as a heat sink for the photomixer 100. As the mixer 100 absorbs light at high optical powers, its temperature increases, resulting in a decrease in photomixer efficiency. The metallized layer 17 behaves as a heat sink, removing heat from the device to improve its conversion efficiency.

Figure 5:
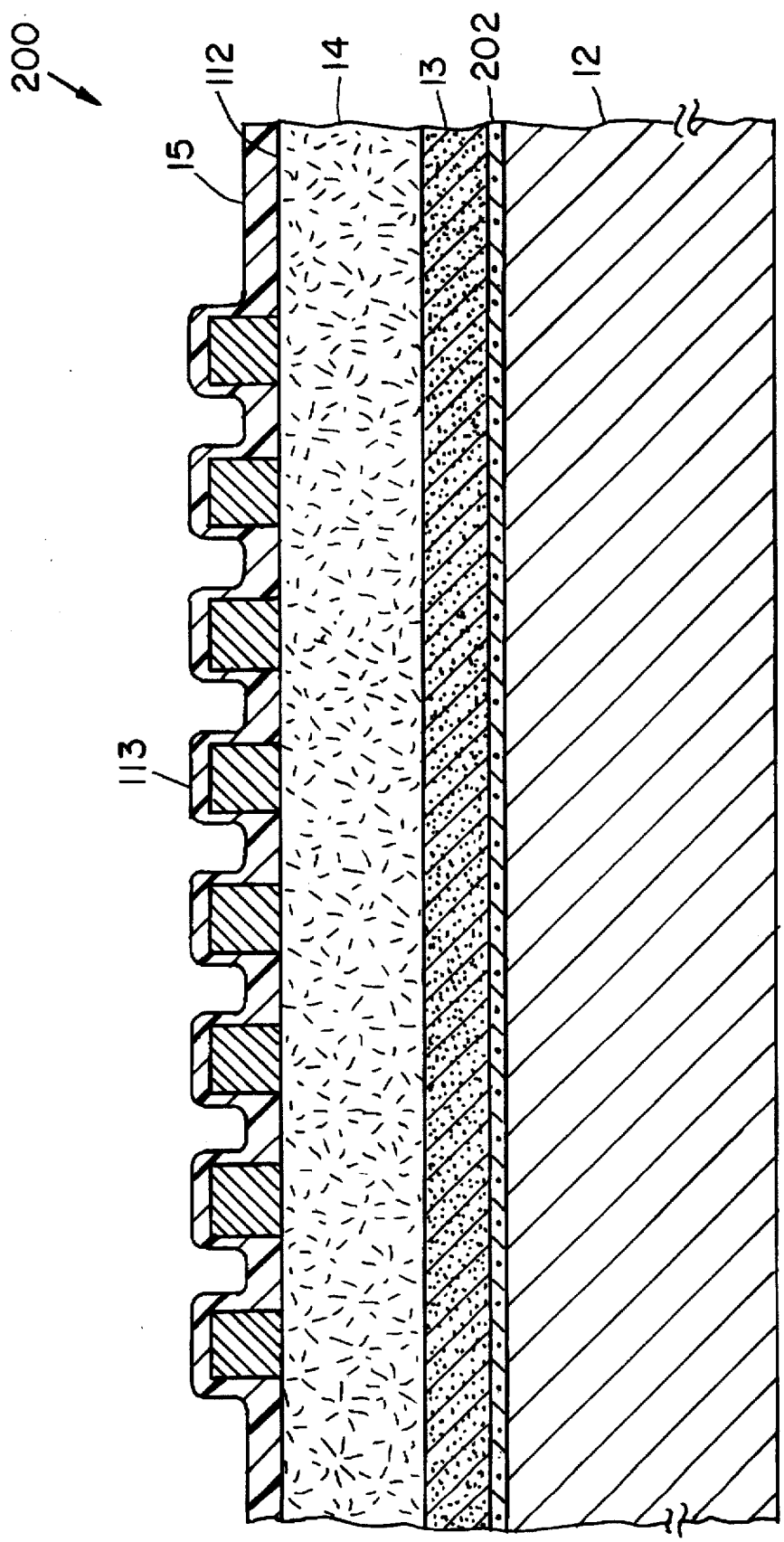
FIG. 5 is a schematic cross-sectional view of another alternative embodiment of the photomixer of the present invention.

FIG. 5 is a schematic cross section of another embodiment 200 of the photomixer of the present invention. In this embodiment, instead of the hole 19 and reflecting layer 17, a dielectric mirror 202 is formed on the top surface of the substrate beneath the electron-hole buffer layer 13. The dielectric mirror 202 includes alternating layers of AlAs and AlGaAs grown on the substrate 12. The dielectric mirror 202, like the reflecting layer 17 in the previously described embodiment, reflects photons back into the active layer 14 where they can be absorbed to form electron-hole pairs. Once again, this improves the conversion efficiency of the photomixer 200.

Figure 6B:
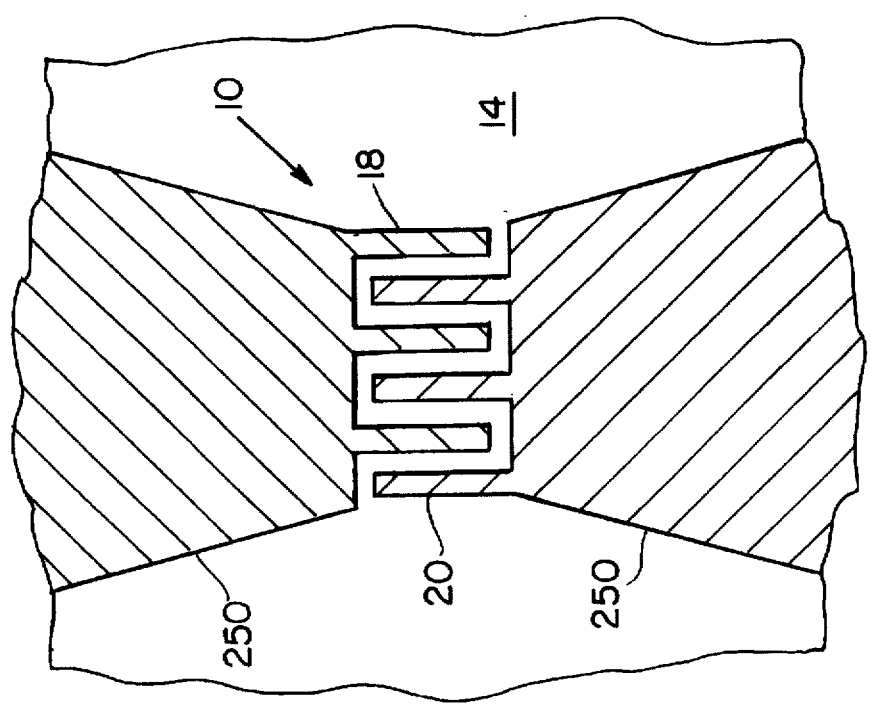
FIG. 6B is an expanded view of a circular region of FIG. 6A.
Figure 6A:
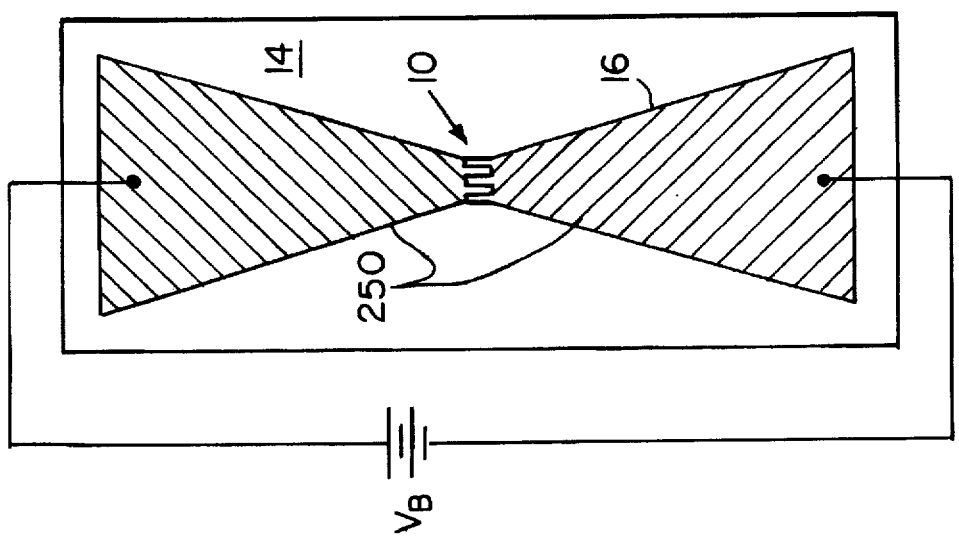
FIG. 6A is a schematic top view of the photomixer of the present invention connected to a planar bow-tie antenna.

FIG. 6A shows an embodiment of the photomixer 10 coupled to a bow-tie antenna 250. The antenna 250 presents a broadband load resistance to the photomixer 10 and therefore efficiently couples the signal at the difference frequency into free space. Because of the broadband load resistance of the bow-tie antenna, it is usable in the wide band low power mode of operation. In this embodiment, the bow-tie antenna 250 and the interdigitated electrodes are formed on the active layer 14 of the photomixer 10. The antenna and electrodes are made from a metallic material such as titanium, aluminum or gold and are deposited on the active layer 14, preferably deposited in a single step, to form the conductive layer 16 of the photomixer 10. The bias voltage $V_B$ used to generate the electric field between electrodes is applied across the conductors of the antenna 250. When the photomixer 10 is illuminated by the coherent optical radiation at two different frequencies, a signal at the difference frequency is radiated away from the photomixer 10 by the antenna 250. It should be noted that while FIG. 6A shows the embodiment of the photomixer indicated by reference numeral 10, any of the embodiments previously described are applicable. Also, other types of planar antenna such as spirals can be used. FIG. 6B is an expanded view of the antenna 250 and interdigitated electrodes 18 and 20 within the circle shown in FIG. 6A.

Figure 7:
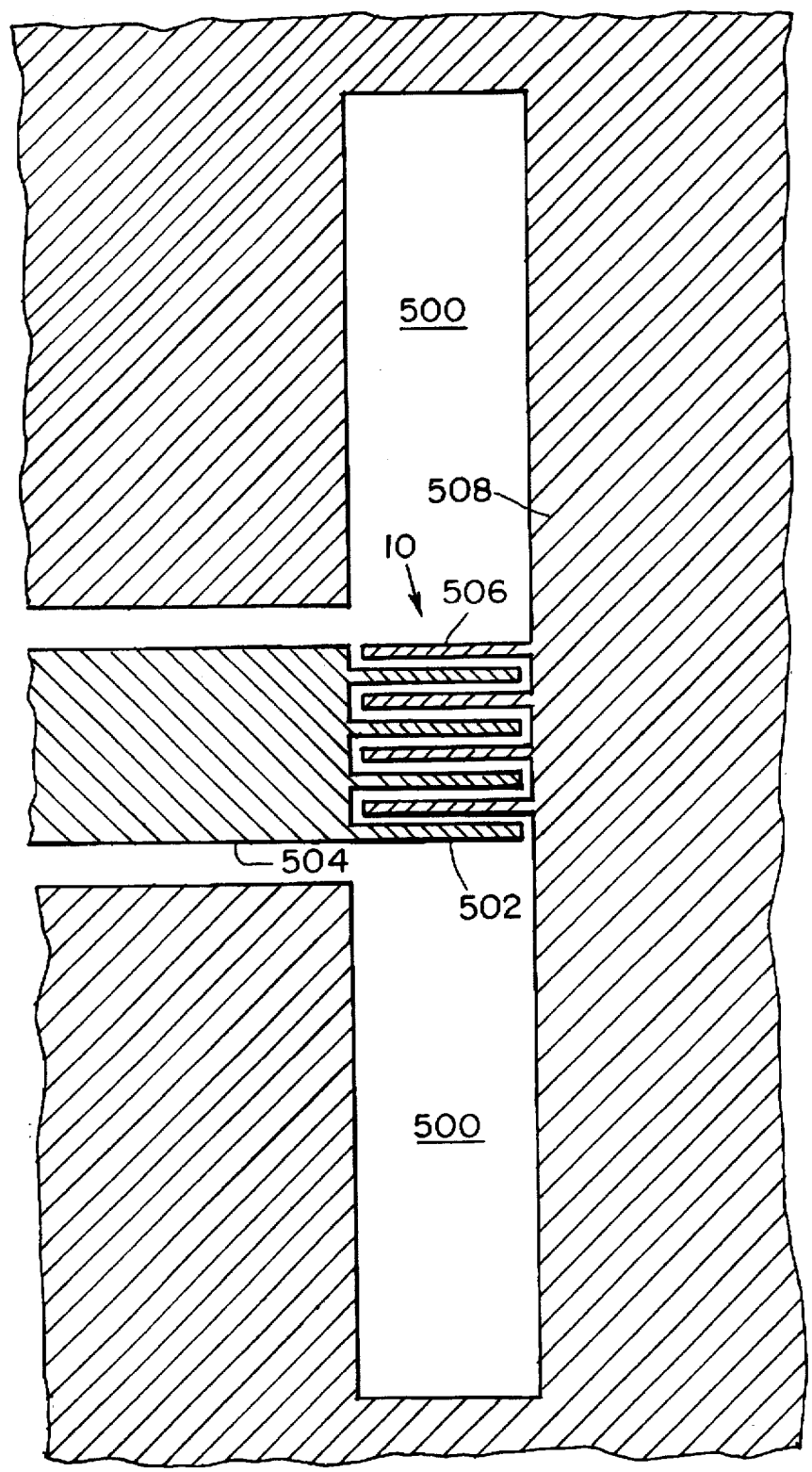
FIG. 7 is a schematic top view of the photomixer of the present invention connected to a planar dipole antenna.

FIGS. 6A and 6B depict a photomixer that can produce modest levels of output power (approximately 1 mW) over a very wide (>1 decade) range of frequency. To generate higher levels of power, the photomixer can be implemented as shown in FIG. 7. In this embodiment, the photomixer 10 is coupled to a resonant slot antenna 500. One set 502 of interdigitized electrodes is connected to the center conductor 504 of a coplanar transmission line. The other set 506 of electrodes is connected to the outer conductor 508 of the transmission line. Once again, it should be noted that all of the photomixer embodiments described herein can be used in the circuit of FIG. 7. At the resonance frequency of the slot 500, the radiation resistance becomes large and the radiation reactance goes to zero. The output power depends linearly on the radiation resistance, so that the embodiment of FIG. 7 is capable of much higher output power for a given optical pump power than the embodiment of FIGS. 6A and 6B. The electrical bandwidth of the embodiment of FIG. 7 is limited to the bandwidth of the resonant slot 500. As in most resonant circuits, the bandwidth is inversely proportional to the resonant resistance. Thus, the increase in output power provided by the slot antenna is accompanied by a decrease in the bandwidth. It will be recognized that the slot is but one of many possible resonant circuits to which the photomixer could be coupled for enhanced output power. Another possibility at high frequencies is the resonant dipole. A candidate resonant circuit for microwave and the lower millimeter-wave frequencies is simply a short length of transmission line separating the photomixer from a load resistor having a much lower resistance $R_L$ than the characteristic impedance $Z_O$ of the transmission line. At the frequency where the transmission line is one quarter of a wavelength long, the resonant load resistance presented to the photomixer is given by $(Z_O)^2/R_L$, which can be a value much larger than the $Z_O$ of any practical transmission line alone.

Figure 8:
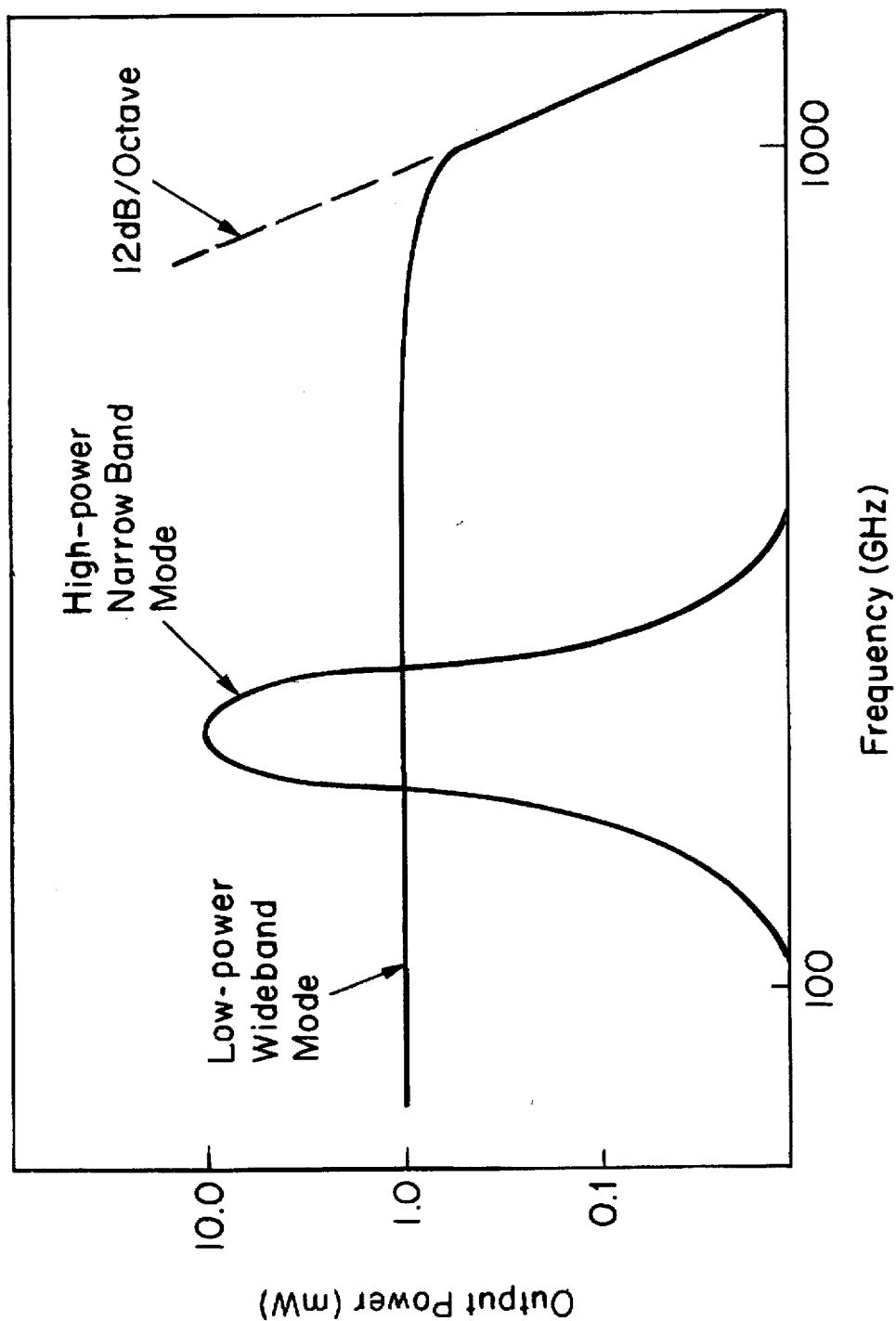
FIG. 8 is a plot of the output power and frequency characteristics of the photomixer in the high-power narrow-band mode and the lower-power wideband mode.

FIG. 8 shows the approximate output characteristics of the photomixer when operated in its two possible modes. In the low-power wideband mode that would result from the antenna coupling in FIGS. 6A and 6B, the output power level is approximately 1 mW and the output bandwidth is approximately 4 octaves, spanning the range from 50 GHz to 1 THz. It should be noted that useful levels of power can still be obtained beyond 1 THz since the photomixer rolls off at only 12 dB/octave. In the high-power narrow-band mode that would result from the antenna coupling in FIG. 7, the output power level is approximately 10 mW and the output bandwidth is approximately 20% of the chosen center frequency, which may occur anywhere between 50 GHz and 1 THz.

Figure 9:
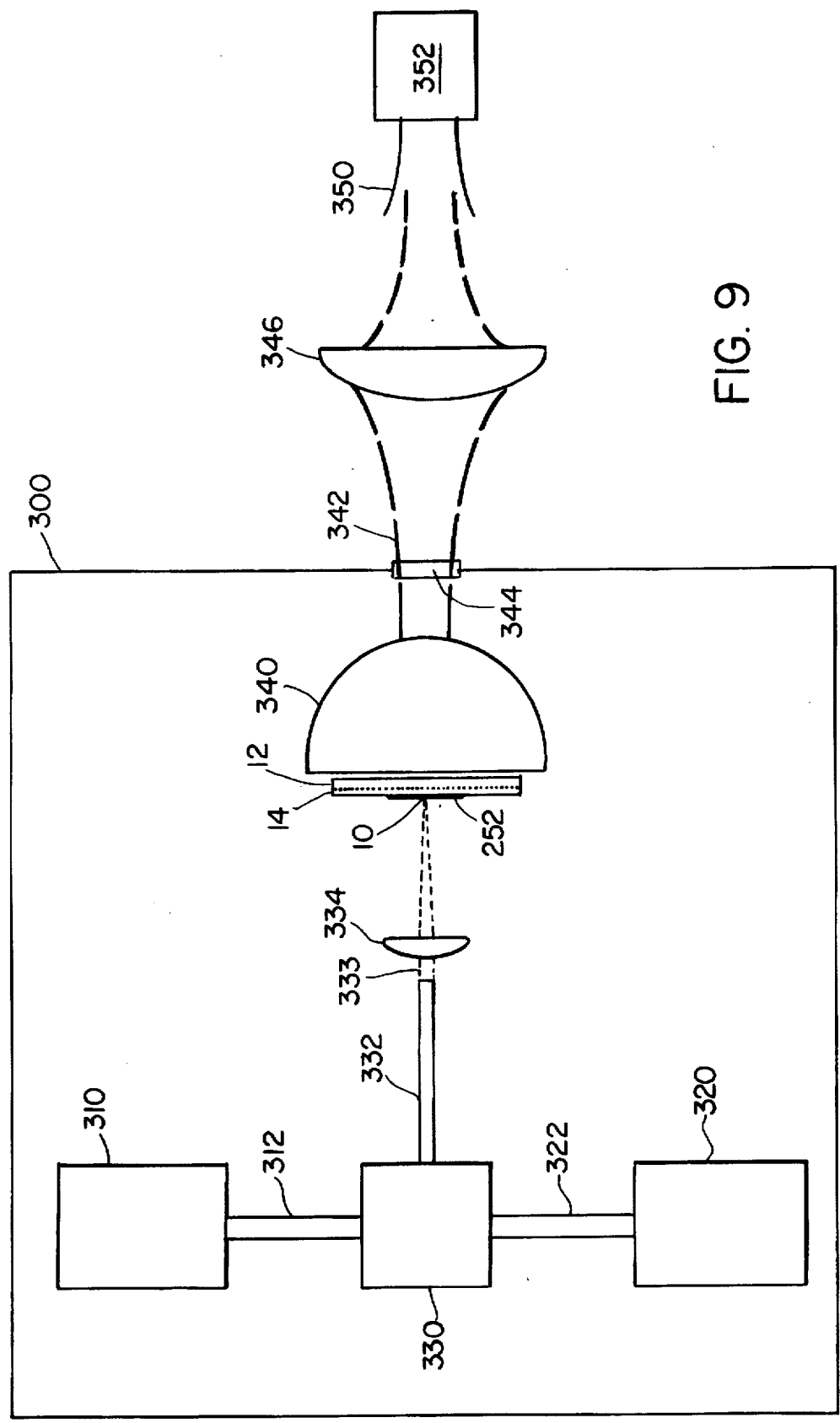
FIG. 9 is a schematic block diagram of a radiation source in accordance with the present invention.

As previously indicated, the present invention is also directed to a signal source or sweep oscillator using the photomixer. FIG. 9 is a schematic illustration of such a source. The oscillator 300 of FIG. 9 comprises a first laser 310 and second laser 320. Preferably, the lasers are tunable single-frequency solid-state or semiconductor-diode lasers such as Ti:Al$_2$O$_3$, Nd:YAG, or GaAs/AlGaAs p-n heterojunction lasers. Each of the lasers 310, 320 is tunable such that the frequency of its output can be set as desired or swept over a range. The output of laser 310 at frequency $v_1$ is coupled to an optical combiner 330 via an optical fiber 312. The output of laser 320 at frequency $v_2$ is coupled to the optical combiner 330 via the optical fiber 322. The combiner 330 combines the two beams into a single output beam containing frequencies $v_1$ and $v_2$ which is coupled by fiber 332 to focusing lens 334.

The combined signal 333 is focused by lens 334 onto the photomixer 10. Both the interdigitated electrodes and a bow-tie, spiral or resonant dipole planar antenna 252, are formed on top of the active layer 14, which is formed on top of the substrate 12. The type of antenna depends upon whether the low-power wideband swept output or the high-power narrow-band constant output is desired. A coherent signal at the difference frequency $\Delta v = |v_1 - v_2|$ is radiated by the planar antenna 252 through the substrate 12 and then through a dielectric hyper-hemispherical lens 340. The lens is preferably made of a highly resistive material having a refractive index close to that of GaAs in the millimeter-wave region. Such materials include semi-insulating GaAs, high-resistivity silicon, and sapphire. The lens 340 transforms the output signal into a gaussian-profile beam 342 which is coupled from the source 300 through a transparent window 344.

The output beam 342 can be used in various applications to perform a multitude of functions. In the configuration shown in FIG. 9, the output beam 342 is focused by a lens 346 into a feedhorn 350. The signal is coupled from the feedhorn 350 to a circuit 352 that is sensitive to the high-frequency radiation.

The lasers 310 and 320 are tunable such that the frequency of the output signal 342 can be varied. The laser frequencies $v_1$ and $v_2$ are selected such that their difference is the desired frequency of the output signal. The output signal can also be swept across a wide range of frequencies to perform frequency-domain analysis on a circuit 352 under test by sweeping the frequency of one or both of the lasers 310 and 320. Because of the high frequencies of the lasers, the output signal can be swept across a very wide range of frequencies in a very short amount of time. Thus, the photomixer acts as a very versatile signal source which outputs a high-frequency continuous-wave, high-power, coherent, unimodal, constant-frequency signal or such a signal whose frequency can be swept over a very wide range at a lower level of output power.

Figure 10:
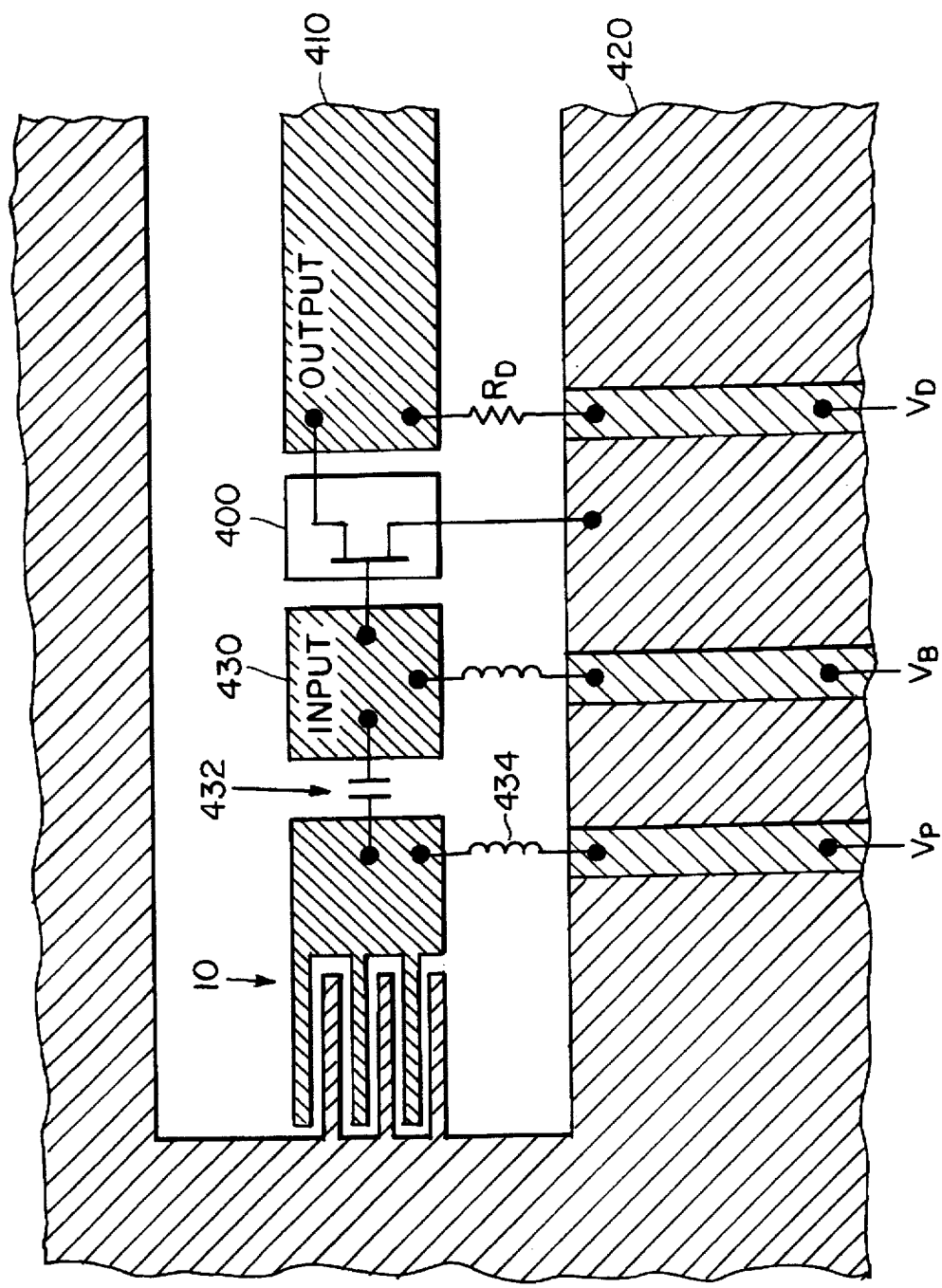
FIG. 10 is a schematic block diagram of a diagnostic testing application of the photomixer of the present invention.

FIG. 10 is a schematic illustration of another application for the photomixer 10. In this application, the photomixer 10 is integrated with and is used to test a high-frequency circuit or device, such as a field-effect transistor (FET) 400, at high frequencies. As shown in FIG. 10, the FET is connected between the center conductor 410 and the ground plane or outer conductor 420 of a coplanar waveguide, with the FET output being connected to the center conductor 410. The FET gate bias voltage $V_B$ is coupled to the FET input, and the FET drain bias voltage $V_D$ is connected to the FET output across bias resistor $R_D$. The input to the FET 400 is connected to an input pad 430 deposited on the waveguide substrate, which can also be the substrate of the photomixer 10. The input pad 430 is coupled to one set of photomixer interdigitated electrodes via a capacitor 432. The photomixer bias voltage $V_P$ is applied to the photomixer via an inductance 434.

To test the FET 400, the photomixer 10 is illuminated by the two lasers as in the source shown in FIG. 9. The difference frequency $\Delta v = |v_1 - v_2|$ can be constant or swept depending upon the test being performed. The difference frequency is coupled to the input of the FET, and the output is sensed to provide the input-output transfer characteristics of the FET 400. After the testing is performed, the photomixer 10 can be eliminated from the coplanar waveguide circuit by depositing metal within the gaps between the interdigitated electrodes. The remainder of the circuit including the waveguide and the FET can be used as they normally would be without the photomixer in the circuit.

While this invention has been particularly shown and described with references to preferred embodiments thereof, it will be understood by those skilled in the art that various changes in form and details may be made therein without departing from the spirit and scope of the invention as defined by the appended claims.

The invention claimed is:

1. A photomixer comprising:

a substrate;

a first layer of at least one III–V compound, the bottom of the first layer facing the substrate and the first layer including molecules of the at least one compound bonded to form a uniform crystal lattice and additional atoms of a column V element in addition to those required to form the uniform crystal lattice, the additional atoms being disposed within the uniform crystal lattice to form defects in the uniform crystal lattice; and a second electrically conductive layer formed over the first layer comprising a region of electrically conductive interdigitated electrodes with openings in the conductive layer exposing said first layer, whereby an electrical signal of a third frequency is coupled from the first layer to the electrically conductive layer as the first layer receives optical radiation of a first and second frequency, the third frequency being the difference between the first and second frequencies of the optical radiation.

2. The photomixer of claim 1 wherein the at least one III–V compound comprises gallium arsenide or indium arsenide or aluminum arsenide.

3. The photomixer of claim 1 wherein the column V element is arsenic.

4. The photomixer of claim 1 wherein the first layer is a low-temperature-grown epitaxial layer.

5. The photomixer of claim 1 wherein the width of an interdigitated electrode is in the range 0.1 to 1.0 µm.

6. The photomixer of claim 1 wherein a gap between interdigitated electrodes is in the range 0.1 to 10 µm.

7. The photomixer of claim 1 wherein the third frequency is within the range of 50 GHz to 1 THz.

8. A radiation source comprising:

a first source of optical radiation for providing optical radiation of a first frequency;

a second source of optical radiation for providing optical radiation of a second frequency;

a photomixer comprising:

a substrate;

a first layer of at least one III–V compound formed on the substrate for receiving said optical radiation of a first frequency and said optical radiation of a second frequency, the bottom of the first layer facing the substrate and the first layer including molecules of the at least one compound bonded to form a uniform crystal lattice and additional atoms of a column V element in addition to those required to form the uniform crystal lattice, the additional atoms being disposed within the uniform crystal lattice to form defects in the uniform crystal lattice; and a second electrically conductive layer formed on the first layer comprising a region of electrically conductive interdigitated electrodes with openings in the conductive layer between the interdigitated electrodes which expose said first layer, whereby an electrical signal of a third frequency is coupled from the first layer to the electrically conductive layer as the first layer receives the radiation of the first and second frequencies, the third frequency being the difference between the first and second frequencies of the optical radiation; and an antenna coupled to the conductive layer to radiate said electrical signal of the third frequency away from the photomixer.

9. The radiation source of claim 8 wherein the power level of the electrical signal is approximately 1 milliwatt.

10. The photomixer of claim 7 wherein the power level of the electrical signal is approximately 1 milliwatt.

11. The photomixer of claim 7 wherein at least one of the first and second sources of optical radiation is tunable such that the frequency of the electrical signal can be swept over a second range of frequencies between 50 GHz and 1 THz.

12. The radiation source of claim 8 wherein the antenna is a resonant antenna such that the electrical signal has a high power level in a narrow frequency band, the range in frequency of the band being approximately 20 percent of a center frequency of the band.

13. The radiation source of claim 12 wherein the power level of the electrical signal within the narrow frequency band is approximately 10 milliwatts.

14. The radiation source of claim 8 wherein the power level of the electrical signal is approximately 10 milliwatts.

15. The radiation source of claim 8 wherein the third frequency is within the range of 50 GHz to 1 THz.

16. The radiation source of claim 8 wherein the first source is a solid state laser.

17. The radiation source of claim 8 wherein the second source is a solid state laser.

18. The radiation source of claim 8 wherein the first source is a semiconductor diode laser.

19. The radiation source of claim 8 wherein the second source is a semiconductor diode laser.

20. The radiation source of claim 8 wherein the first frequency of the first source is tunable.

21. The radiation source of claim 8 wherein the second frequency of the second source is tunable.

22. A photomixer comprising:

a substrate;

a low-temperature-grown epitaxial first layer of at least one III–V compound, the bottom of the first layer facing the substrate and the first layer including molecules of the at least one compound bonded to form a uniform crystal lattice and additional atoms of a column V element in addition to those required to form the uniform crystal lattice, the additional atoms being disposed within the uniform crystal lattice to form defects in the uniform crystal lattice; and a second electrically conductive layer formed over the first layer comprising a region of electrically conductive interdigitated electrodes with openings formed in the conductive layer between the electrodes to expose the first layer, whereby an electrical signal of a third frequency is coupled from the first layer to the electrically conductive layer as the first layer receives the optical radiation of a first and second frequency, the third frequency being the difference between the first and second frequencies of the optical radiation.

23. The photomixer of claim 22 wherein the at least one III–V compound comprises gallium arsenide or indium arsenide or aluminum arsenide.

24. The photomixer of claim 22 wherein the column V element is arsenic.

25. The photomixer of claim 22 wherein the width of an interdigitated electrode is in the range 0.1 to 1.0 μm.

26. The photomixer of claim 22 wherein a gap between interdigitated electrodes is in the range 0.1 to 10.0 μm.

27. A radiation source comprising:

a first source of optical radiation for providing optical radiation of a first frequency;

a second source of optical radiation for providing optical radiation of a second frequency;

a photomixer comprising:

a substrate;

a low-temperature-grown epitaxial first layer of at least one III–V compound formed on the substrate, the bottom of the first layer facing the substrate and the first layer including molecules of the at least one compound bonded to form a uniform crystal lattice and additional atoms of a column V element in addition to those required to form the uniform crystal lattice, the additional atoms being disposed within the uniform crystal lattice to form defects in the uniform crystal lattice;

a second electrically conductive layer formed over the first layer comprising a region of electrically conductive interdigitated electrodes with openings formed in the conductive layer between the electrodes to expose the first layer, whereby an electrical signal of a third frequency is coupled from the first layer to the electrically conductive layer as the first layer receives the optical radiation of a first and second frequency, the third frequency being the difference between the first and second frequencies of the optical radiation; and an antenna coupled to the conductive layer to radiate a signal of the third frequency away from the photomixer.

28. The radiation source of claim 27 wherein the first source is a solid state laser.

29. The radiation source of claim 27 wherein the second source is a solid state laser.

30. The radiation source of claim 27 wherein the first source is a semiconductor diode laser.

31. The radiation source of claim 27 wherein the second source is a semiconductor diode laser.

32. The radiation source of claim 27 wherein the first frequency of the first source is tunable.

33. The radiation source of claim 27 wherein the second frequency of the second source is tunable.

34. A sweep oscillator comprising:

a first tunable source of optical radiation for providing optical radiation of a first frequency;

a second tunable source of optical radiation for providing optical radiation of a second frequency;

a photomixer comprising:

a substrate;

a first layer of at least one III–V compound formed on the substrate for receiving said optical radiation of a first frequency and said optical radiation of a second frequency, the bottom of the first layer facing the substrate and the first layer including molecules of the at least one compound bonded to form a uniform crystal lattice and additional atoms of a column V element in addition to those required to form the uniform crystal lattice, the additional atoms being disposed within the uniform crystal lattice to form defects in the uniform crystal lattice; and a second electrically conductive layer formed on the first layer comprising a region of electrically conductive interdigitated electrodes with openings in the conductive layer between the interdigitated electrodes which expose said first layer, whereby an electrical signal of a third frequency is coupled from the first layer to the electrically conductive layer as the first layer receives the radiation of the first and second frequencies, the third frequency being the difference between the first and second frequencies of the optical radiation, and being sweepable over a range of frequencies as at least one of the first and second tunable sources of optical radiation is tuned; and a planar antenna coupled to the conductive layer to radiate said electrical signal of the third frequency away from the photomixer.

* * * * *

UNITED STATES PATENT AND TRADEMARK OFFICE
CERTIFICATE OF CORRECTION

PATENT NO. : 5,663,639
DATED : September 2, 1997
INVENTOR(S) : Elliott R. Brown and Frank W. Smith It is certified that error appears in the above-indentified patent and that said Letters Patent is hereby corrected as shown below:

Column 11, line 20,

Claim 10, line 2, delete "electrical" and replace it with --output--.

Signed and Sealed this

Sixth Day of January, 1998

Attest:

BRUCE LEHMAN

*Attesting Officer*                *Commissioner of Patents and Trademarks*